United States Patent [19]

Thomas et al.

[11] Patent Number: 4,481,070
[45] Date of Patent: Nov. 6, 1984

[54] DOUBLE PLANARIZATION PROCESS FOR MULTILAYER METALLIZATION OF INTEGRATED CIRCUIT STRUCTURES

[75] Inventors: Mammen Thomas, San Jose; Linda J. Koyama, Sunnyvale, both of Calif.

[73] Assignee: Advanced Micro Devices, Inc., Sunnyvale, Calif.

[21] Appl. No.: 596,745

[22] Filed: Apr. 4, 1984

[51] Int. Cl.³ .................... B44C 1/22; C03C 15/00; C03C 25/06
[52] U.S. Cl. .................... 156/643; 156/651; 156/657; 204/192 E
[58] Field of Search .............. 156/643, 646, 650–653, 156/657, 662, 667, 659.1; 204/192 E; 427/38, 39, 93

[56] References Cited

U.S. PATENT DOCUMENTS 4,089,766  5/1978  Paal et al. .................. 156/668 X
4,377,438  3/1983  Moriya et al. .............. 156/657 X
4,451,326  5/1984  Gwozdz ....................... 156/643

Primary Examiner—William A. Powell
Attorney, Agent, or Firm—Patrick T. King

[57] ABSTRACT

A process is disclosed for the planarization of an integrated circuit structure by a two stage planarization process which comprises: applying over a metallization layer, having one or more openings therein, a layer of insulation sufficiently thin to avoid formation of voids in the portion of the insulation applied in the openings in the metallization layer; smoothing the insulation layer by removing the high portions of the insulation by, for example, dry etching the insulation; applying a further layer of insulation over the first insulation layer; and smoothing the further layer of insulation by removing the high portions by, for example, dry etching; whereby the resultant smoothed insulation surface will be substantially planar and substantially void-free. In a preferred embodiment, a second material, such as a photoresist material, is coated over the insulation layer prior to the smoothing step, particularly when an anisotropic dry etching process is used, to insure that only the high portions of the insulation layer are removed in the etching step.

16 Claims, 17 Drawing Figures

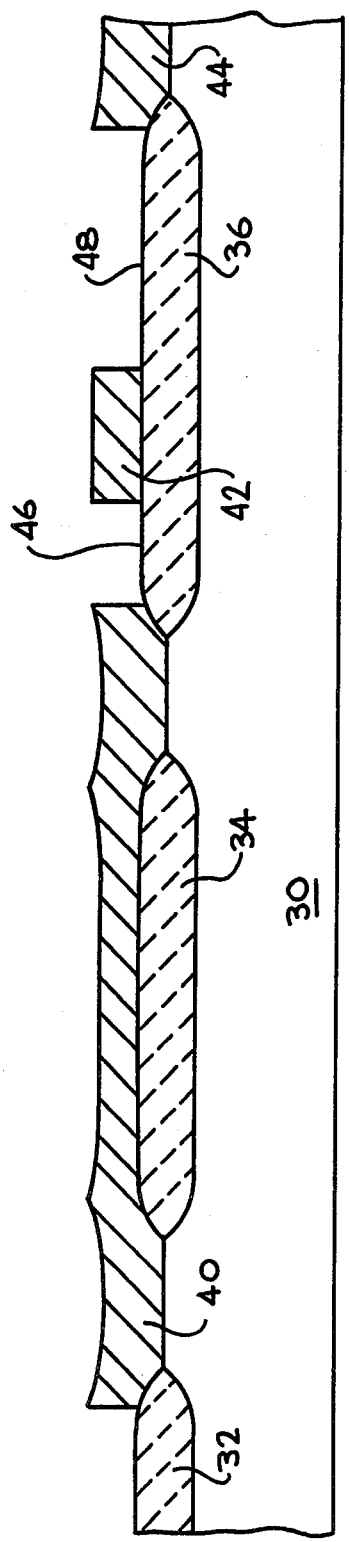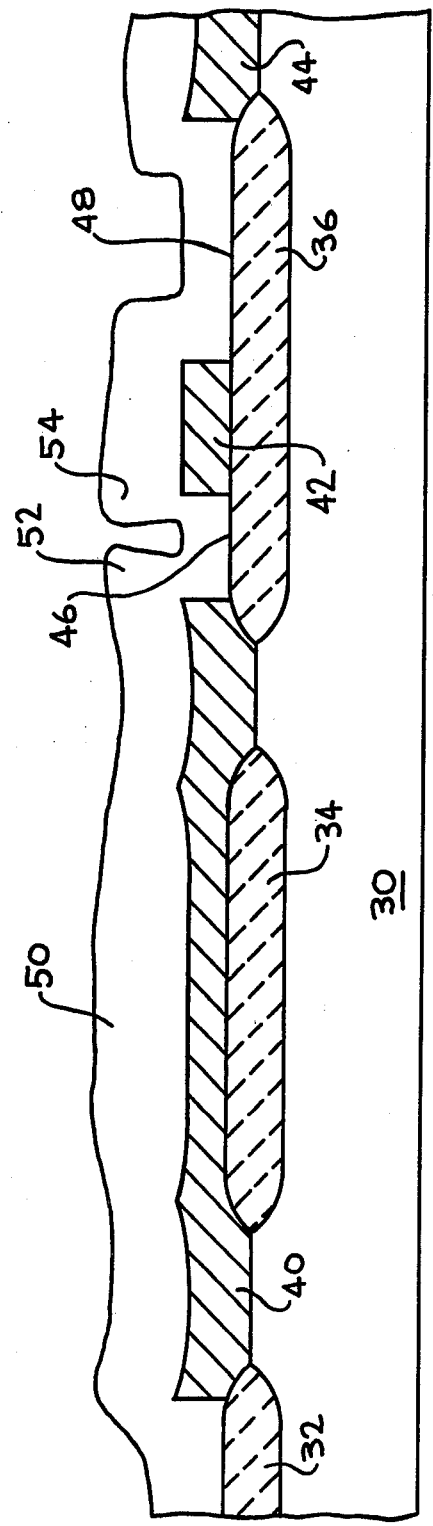

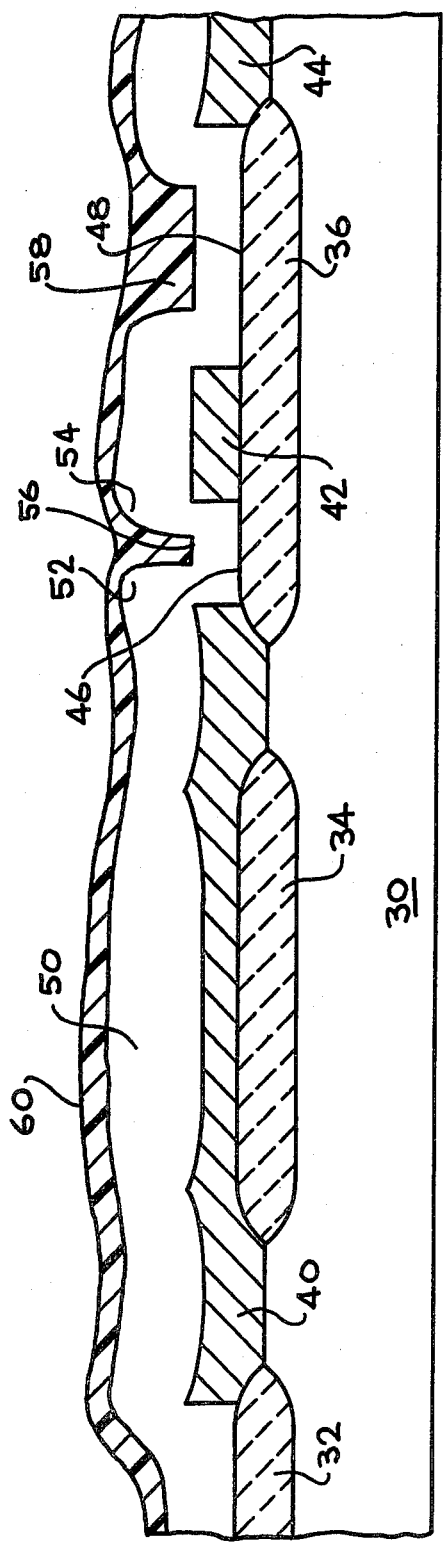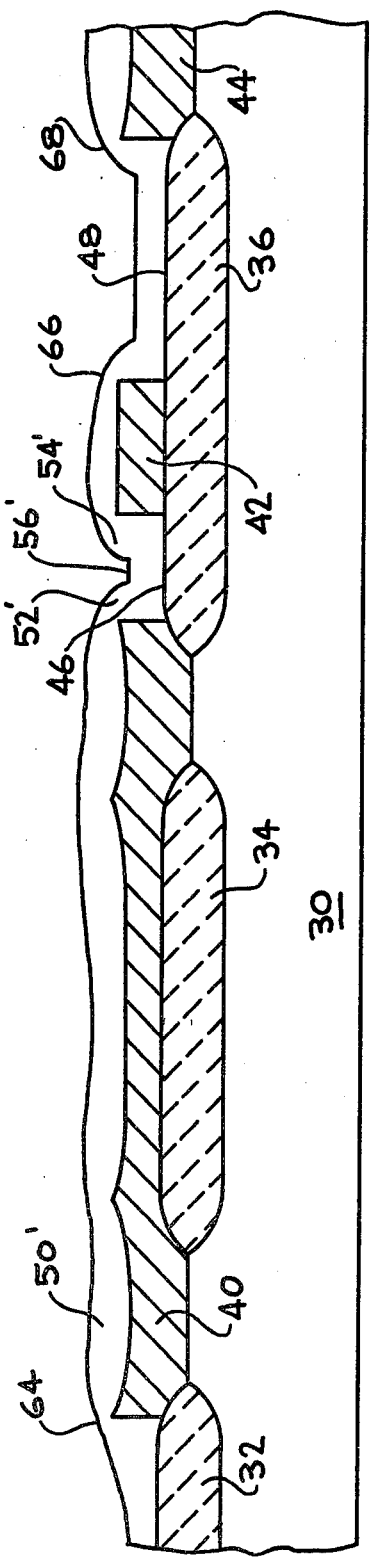
FIG. 2C
FIG. 2D

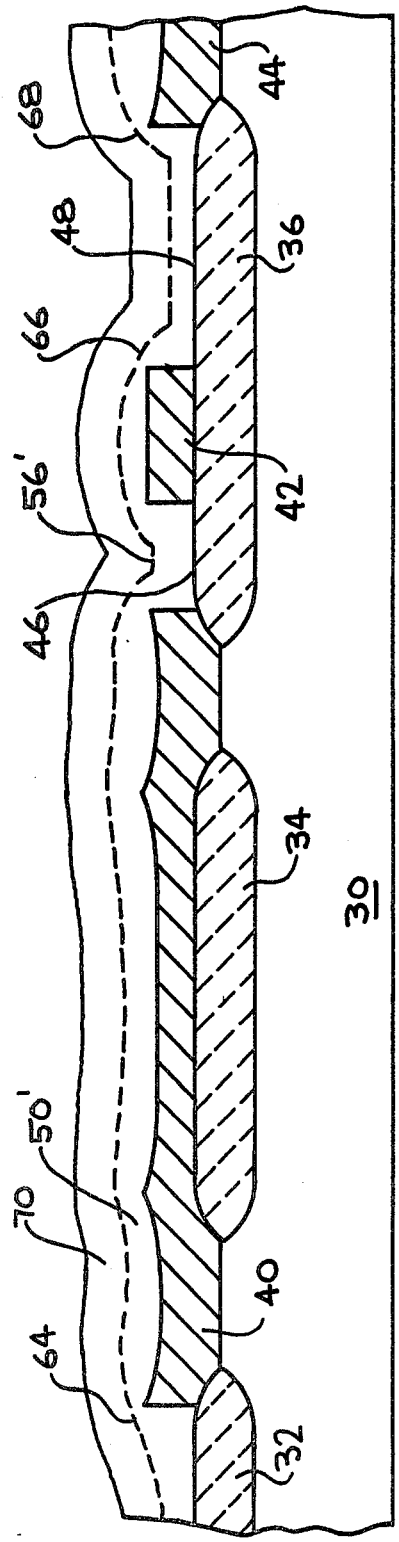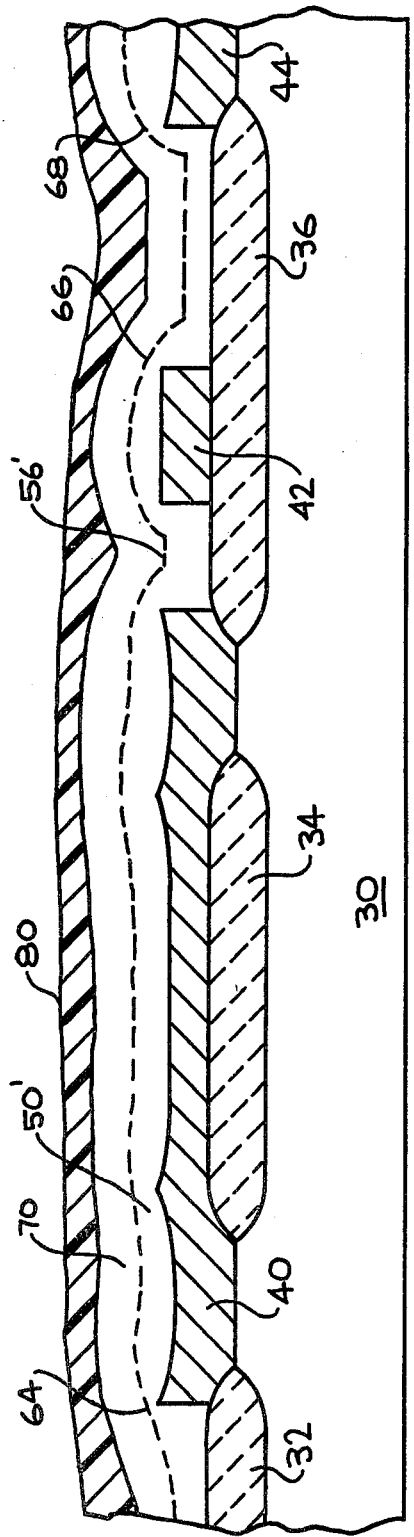
FIG. 3A
FIG. 3B

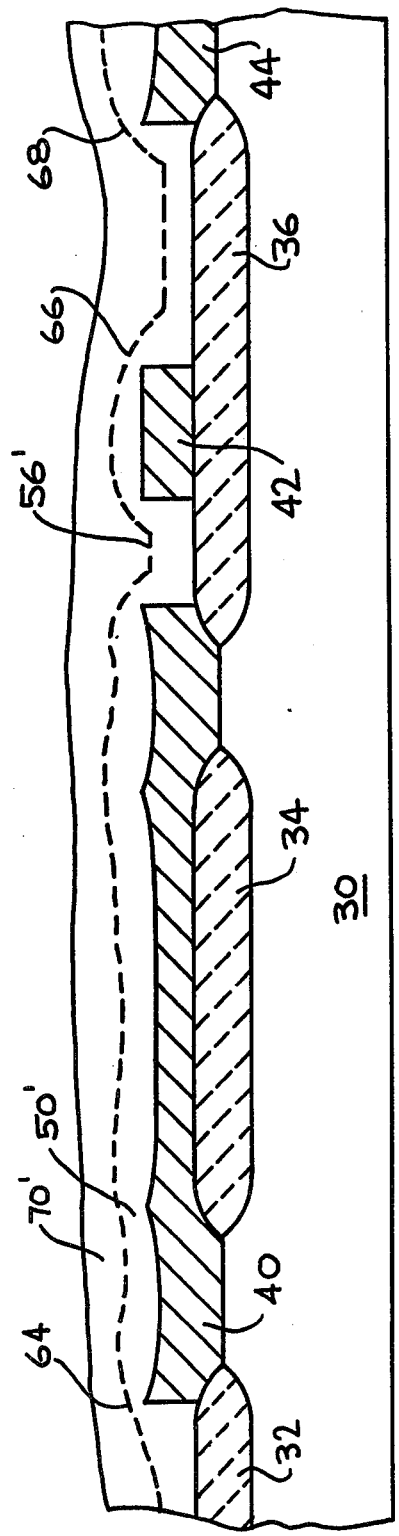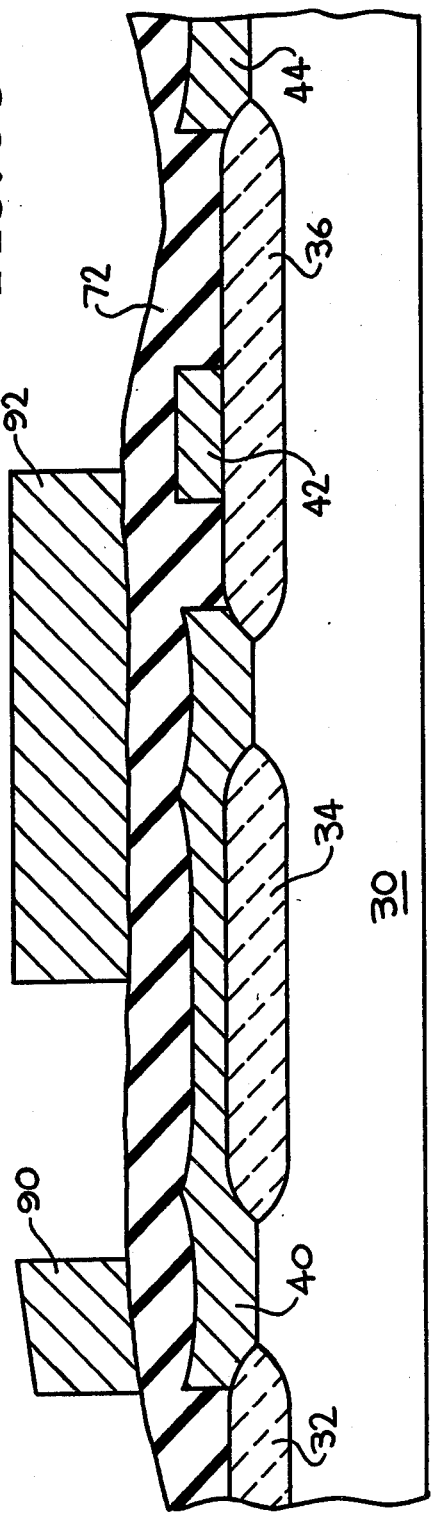

DOUBLE PLANARIZATION PROCESS FOR MULTILAYER METALLIZATION OF INTEGRATED CIRCUIT STRUCTURES

BACKGROUND OF THE INVENTION

1. Technical Field of the Invention

This invention relates to a process for making integrated circuit structures having a plurality of metallization layers. More particularly, this invention relates to an improved process of planarization to smooth an insulation layer placed between metallization layers.

2. Description of the Prior Art

In the production of integrated circuit structures, it has become increasingly important to provide structures having a plurality of metallization layers due to the ever increasing density of the circuit elements in the structure. To provide overlying metallization layers without discontinuities or other flaws, it is desirous to provide an underlying surface for the metallization layer which is as flat or planar as possible. This may be accomplished using doped glass which is subsequently heated to its softening point to provide smoother step coverage and more planar surface beneath the subsequent metallization layer. However, the application of heat to an integrated circuit structure to soften a doped glass becomes undesirable.

It has, therefore, become the practice to smooth the surface of an insulation layer in preparation for a subsequently applied metallization layer by a process of planarization. An insulation material, such as an oxide, is applied over the first metallization layer followed by application of another etchable material which can be easily removed after the etching such as a layer of photoresist. The insulation and photoresist are then subjected to a dry etch, such as an isotropic reactive ion etch. The dry etch removes a portion of the photoresist as well as the raised portions of the underlying insulation. The photoresist is then selectively removed to provide a smoother underlying surface having better step coverage. If the planarization is still not as smooth as desired, the prior art approach uses a thicker insulation layer and then a deeper etch back of the raised portions of the insulation.

However, the advent of newer integrated circuit technology, using reduced metal pitch as well as reduced spacing between metal lines, has made the use of such thick insulation layers to achieve better planarization counterproductive. The use of such thick insulation layers can result in the formation of voids adjacent the bottom of the narrow openings in the metallization layer due to the tendency of the deposited insulation material, such as an oxide, to deposit faster adjacent the top of the sidewalls of openings.

If such a void occurs, which is then covered up as further insulation material is applied, subsequent application of, for example, photoresist material would not be able to penetrate this void area. Subsequent etching would, therefore, remove the insulation covering the void thus exposing the void and, in essence, providing a nonplanar stepped area in diametric opposition to the attempted planarization. Furthermore, the insulation beneath the bottom portion of the now exposed void may be etched to thin the insulation over the underlying surface to an unacceptable thickness.

Quite surprisingly, it has now been discovered that the desired planarization can be achieved, even when smaller metal pitches and closer spacing between metal lines are used, without the risk of forming undesirable voids in the insulation layer.

SUMMARY OF THE INVENTION

It is therefore an object of the invention to provide an improved process for planarization of an insulation layer applied over a metallization layer in an integrated circuit structure.

It is another object of the invention to provide an improved process for planarization of an insulation layer applied over a metallization layer in an integrated circuit structure by the use of a two step planarization process.

It is yet another object of the invention to provide an improved process for planarization of an insulating layer applied over a metallization layer in an integrated circuit structure by the use of a two step planarization process wherein a thin layer of insulation material is placed over the metallization layer, and, after smoothing by, for example, dry etching to remove the higher portions of the insulation, a further layer of insulation material is applied and then smoothed.

It is a further object of the invention to provide an improved process for planarization of an insulating layer applied over a metallization layer in an integrated circuit structure by the use of a two step planarization process wherein a thin layer of insulation material is placed over the metallization layer, which, after coating with a second etchable material, is smoothed by dry etching to remove the higher portions of the insulation material after which the second material is removed and a further layer of insulation material is applied and smoothed.

In accordance with the invention, an improved process is provided for the planarization of an integrated circuit structure which comprises: applying over a metallization layer, having one or more openings therein, a layer of insulation sufficiently thin to avoid formation of voids in the portion of the insulation applied in the openings in the metallization layer; smoothing the insulation layer by removing the high portions of the insulation by, for example, dry etching the insulation; applying a further layer of insulation over the first insulation layer; and smoothing the further layer of insulation by removing the high portions by, for example, dry etching; whereby the resultant smoothed insulation surface will be substantially planar and substantially void-free.

BRIEF DESCRIPTION OF THE DRAWINGS

FIG. 2A is a vertical cross-section of an integrated circuit structure having a patterned metallization layer thereon.

FIG. 2B is a vertical cross-section of an integrated circuit structure having a first planarization insulation layer applied thereon in accordance with the invention.

FIG. 2C is a vertical cross-section of the structure of FIG. 2A with a layer of a second material spun or deposited over the insulating layer to make a smooth transition over steps.

FIG. 2D is a vertical cross-section of the integrated circuit structure of FIG. 2B with the second material and the insulation material partially etched away.

FIG. 3A is a vertical cross-section of the structure of FIG. 2D having a second insulation layer applied over the partially etched away first insulation layer.

FIG. 3B is a vertical cross-section of the structure of FIG. 3A with a further layer of a second material applied over the second insulation layer for planarity.

FIG. 3C is a vertical cross-section of the structure of FIG. 3B subject to a second etching wherein a portion of the further layer of second material and second insulation layer have been removed.

FIG. 4A is a vertical cross-section of the structure of FIG. 3C having a further metallization layer applied thereon and patterned to form openings in the second metallization layer.

DESCRIPTION OF THE PREFERRED EMBODIMENT

The invention provides an improved process for achieving planarization of insulation placed over metallization layers to facilitate the application of further layers of metal while avoiding discontinuities which may occur if the insulation surface, to which the further metallization layer is applied, is not sufficiently planar.

Figure 1A:
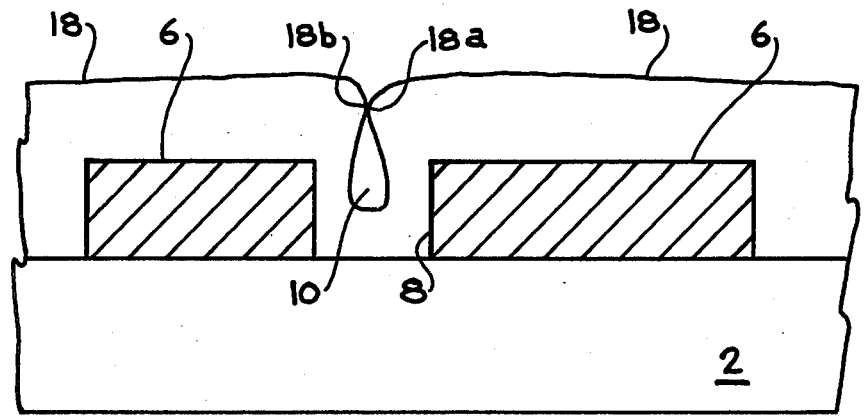
FIG. 1A is a vertical cross-section of a portion of a prior art integrated circuit structure illustrating the first step of planarization with an applied layer of oxide forming a void in an opening in the metallization layer.
Figure 1B:
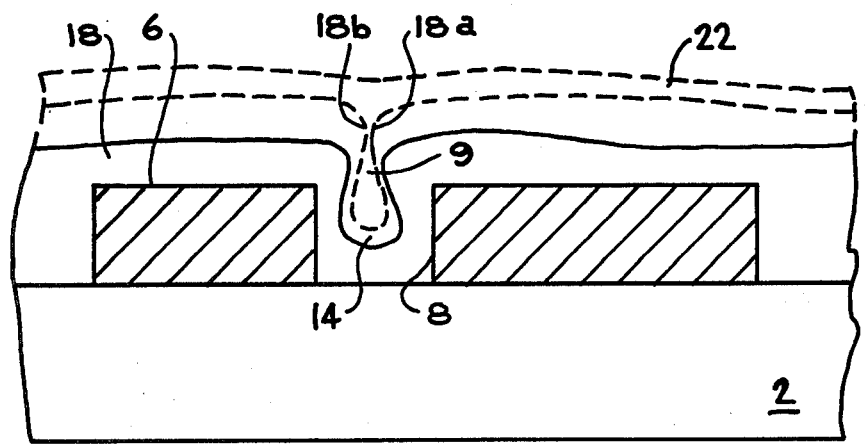
FIG. 1B is a vertical cross-section of the prior art structure of FIG. 1A after the applied oxide layer has been partially etched away.

Referring to FIGS. 1A and 1B, the problems of the prior art are illustrated. An underlying integrated circuit structure 2 has deposited thereon a metallization layer which has been patterned to provide metal lines 6 and an opening 8. An insulation material, such as an oxide layer 18, is applied over metal lines 6. However, opening 8 is a rather small or narrow opening between adjacent metal lines 6. Therefore, the fill-in by insulation material 18 has resulted in the formation of cusps 18a and 18b which have grown together just above the top of opening 8 leaving a trapped or void area 10 which contains no insulation material.

Following the application of the insulation material, in accordance with standard practice, a layer 22 of a second material responsive to the same smoothing technique as the insulation material, such as, for example dry etching, is applied over insulation layer 18. This second material is preselected to be easily removable after the smoothing operation such as, for example, a photoresist material which may be dissolved after the dry etching process is completed.. The two layers are then subjected to a dry etch, such as a plasma etch, to remove the upper portions of both insulation layer 18 and layer 22.

However, as shown in FIG. 1B, the etchant removes a sufficient amount of insulation layer 18 to expose the void area 10 by creating an opening 9 between the now etched away cusps 18a and 18b, as seen at 14 in FIG. 1B. Furthermore, not only is opening or void 10 now exposed, but the plasma etching may further etch away a portion of layer 18 beneath void 10 and, as shown at 14, thereby unduly thinning out the amount of oxide over the underlying integrated circuit structure 2.

Turning now to FIG. 2A, the process of the invention will be described and illustrated in a step by step fashion. In FIG. 2A, an integrated circuit structure 30, is illustrated having oxide portions 32, 34, and 36 previously grown or deposited thereon. Metal lines 40, 42, and 44 represent a patterned metallization layer which has been applied to the structure. It will be noted that opening 46 in between metal lines 40 and 42 is considerably narrower than opening 48 between metal lines 42 and 44.

Before a second metallization layer may be deposited and patterned over metal lines 40, 42, and 44, it will be necessary to provide an insulation layer having sufficient thickness for low capacitance and good breakdown and shorting protection between layers. This insulation layer, which may be formed or applied by deposition or growth of an oxide layer, must be then planarized to provide as smooth a surface as possible for a subsequently applied metallization layer to avoid discontinuities in the second metallization layer. In the prior art, deposition or growth of insulation of sufficient thickness into the narrow opening 46, without creating a void, would have been difficult.

Turning now to FIG. 2B, an insulation layer 50 has been applied over metal lines 40, 42, and 44. It will immediately be noted that the cusps portions 52 and 54 of insulation layer 50 have not built up sufficiently to create a void in insulation layer 50 as in the prior art practice previously illustrated in FIG. 1A. This is because insulation layer 50 has been applied as a thin layer having a thickness which will be dependent on the spacing between the most closely spaced metal lines, such as the opening shown at 46. The more closely the metal lines are spaced together, the thinner the initial insulation layer 50 must be in accordance with the process of the invention to avoid formation of voids in the portion of the insulation material which fills the narrow openings between adjacent metal lines.

The insulation material used conveniently may be an oxide, such as silicon dioxide. However, it should be noted that other insulation materials, such as silicon nitride, alumina, or silicon oxide doped with phosphorus, may be used instead of silicon dioxide.

The thickness of the first layer of insulation material, in accordance with the invention, will be dependent upon the spacing between adjacent metal lines. The narrower the spacing between narrowly spaced apart adjacent metal lines, the thinner the first layer of insulation material must be. For example, when the spacing between two adjacent metal lines is about 2 microns, the thickness of the first layer of insulation material should be about 8000 Angstroms. If the spacing between adjacent metal lines is only about 1.5 microns, then a thickness of about 5000 Angstroms is selected for the first insulation layer.

In FIG. 2C, a layer 60 of a second material has been deposited over insulation layer 50. The purpose of layer 60 is to provide a material which can fill in the low portions not filled in by insulation material 50, such as shown at 56 and 58. The material comprising second layer 60 should be a material capable of being removed by a smoothing process such as, for example, dry etching, at relatively the same, or slightly slower, rate as insulation material 50 is being removed. Furthermore, material 60 should comprise a material, such as an organic material, which may, after the smoothing operation, be selectively removable, for example, by wet chemical means without disruption of the insulation layer.

A particularly convenient material which is already in use for other purposes in integrated circuit manufacture is an organic coating of photoresist material. Photoresist material, such as, for example, Shipley 1470 or Kodak 747 has been found to be etchable at about the same rate as silicon dioxide with appropriate etch conditions such as are well known to those skilled in the art when both are present together as shown in FIG. 2C. After the smoothing process, such as dry etching, the remnants of the photoresist materials still remaining may then be removed by an organic solvent which will not attack the underlying oxide layer.

The thickness of the photoresist or other second coating layer should be sufficient to fill in the low spots or portions of the insulation layer without unduly building up the thickness of the higher portions of the insulation layer. This will vary based on the type of smoothing or removal means used to subsequently remove portions of the insulation material and any other coating material, such as photoresist, which has been placed over the insulation layer. Presuming that the two materials have been preselected to provide approximately the same removal rate, a process, such as an anisotropic dry etching as with a plasma etch will remove equal amounts of both materials.

Since the photoresist material remaining will be subsequently dissolved away, it is also important that the photoresist material not be unduly thick over the raised portions of insulation to permit the etching means to remove the high portions since a removal of these high portions of the insulation material is the ultimate goal of the smoothing out step.

Turning now to FIG. 2D, the integrated circuit structure is shown after the first smoothing step wherein oxide layer 50 and overlying photoresist material 60 have been exposed to a dry etching, such as an anisotropic reactive ion etching and the remaining photoresist material has been removed by an oxygen plasma followed by an organic solvent, such as acetone. It will be noted that most of the cusps 52 and 54 have been removed leaving only portions 52' and 54' on layer 50'. It will be further noted that opening 56' is very shallow as compared to opening 56 in FIG. 2C, thus permitting or facilitating easy fill in of this indentation during a subsequent planarization stage despite the narrow width of opening 56'.

Thus, the foregoing steps and accompanying figures have described the first planarization stage of the double planarization process of the invention. It will be noted, at this point, that a substantially planar surface has already been created without the formation of any voids. However, due to the thinness of initial insulation layer 50 as well as its subsequent further thinning down by the etching process applied thereto, the remaining oxide layer 50' is rather thin adjacent some of the corners of the metal lines, such as shown at 64, 66, and 68 in FIG. 2D. Furthermore, as previously noted, the opening 56' remains which must be filled in before the second metallization layer may be applied.

Turning now to FIG. 3A, a second layer 70 of insulation material, such as an oxide material, has been applied over insulation layer 50'. It will immediately be noted that the second insulation material has filled in the opening at 56' as well as provided a thickening of the oxides at covering over portions 64, 66, and 68.

As shown in FIG. 3B, second insulation layer 70 may be coated with a further layer 80 of photoresist material which functions in the same manner as layer 60 in the first planarization stage. Second insulation layer 70 and second layer 80, if present, are then etched as in the first planarization stage to provide a layer 70' overlying first oxide layer 50' as shown in FIG. 3C. It will be seen now that the portions 64, 66, and 68, respectively overlying metal lines 40, 42, and 44, now have a sufficient thickness of oxide thereon to provide the requisite insulation. It will also be noted that opening 56' has been filled and smoothed over.

It should be further noted, at this point, that in applicants' two stage planarization process, it may not be necessary to use the second material over the insulation material prior to etching, particularly when used in the second stage since the first stage of planarization would have already rendered the first layer of insulation substantially planar, thus permitting a smoother deposition of the second insulation layer over the first previously planarized insulation layer.

Figure 4B:
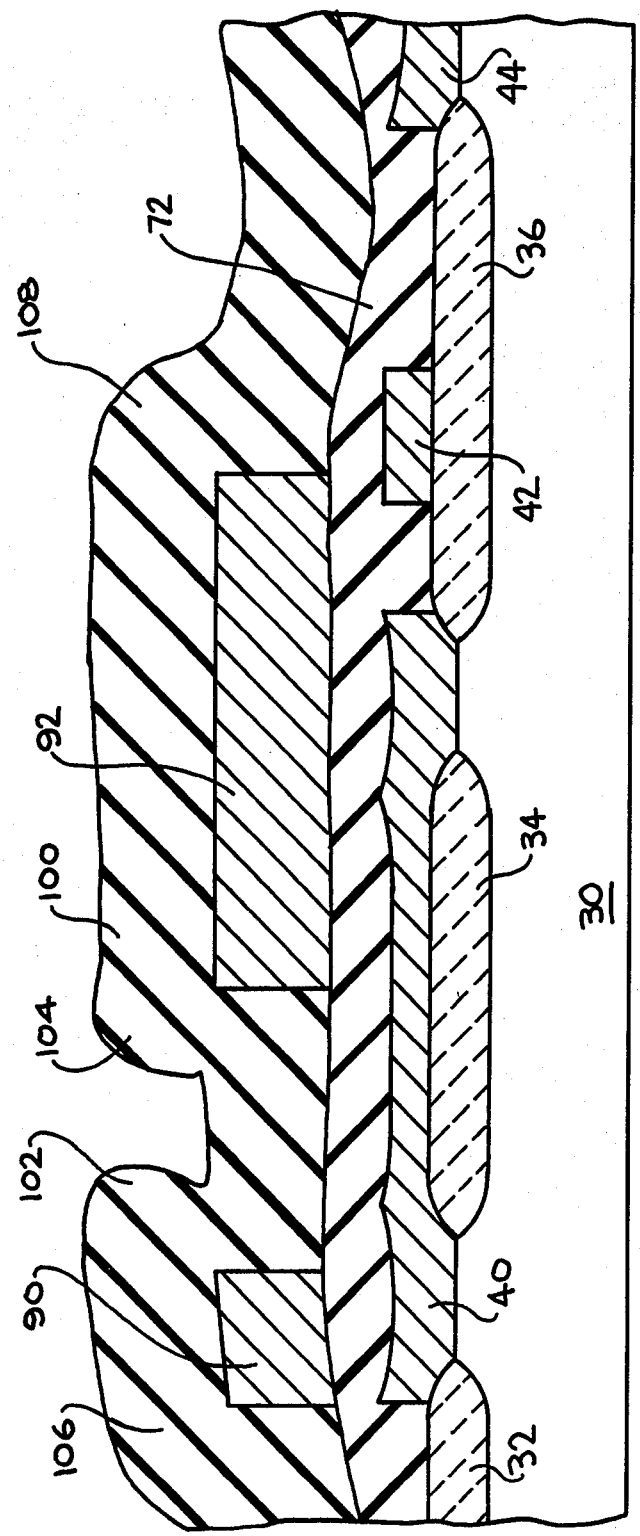
FIG. 4B is a vertical cross-section of the structure of FIG. 4A having an insulation layer deposited over the second metallization layer.

The integrated circuit structure has now been sufficiently planarized to safely permit application of a second patterned metallization layer to form metal lines 90 and 92 as shown in FIG. 4A. Metal lines 90 and 92 overly oxide layers 50' and 70' which will now be designated as a single insulation layer 72. In FIG. 4B a first insulation layer 100 has been applied over metal lines 90 and 92 forming cusps or shoulder portions 102, 104, 106, and 108.

Figure 4C:
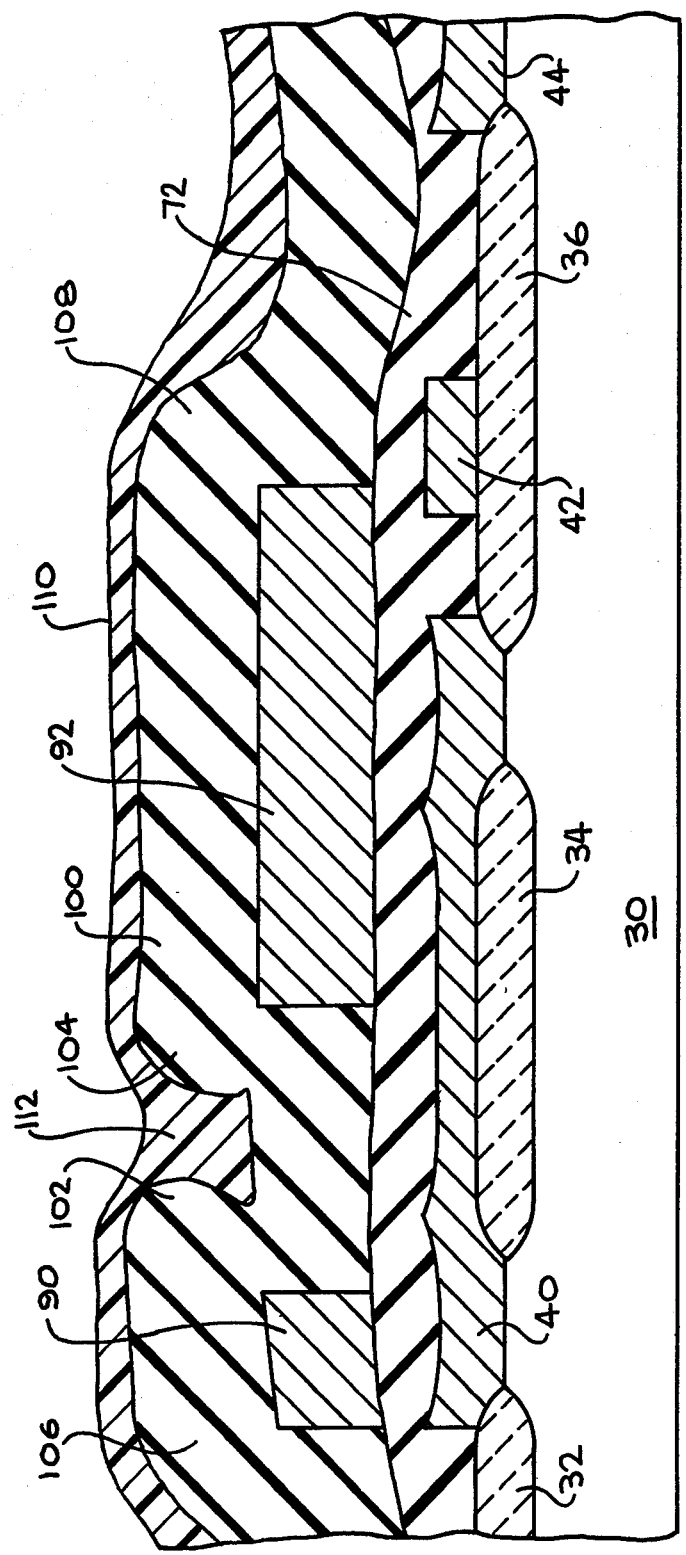
FIG. 4C is a vertical cross-section of the structure of FIG. 4B having a layer of a second material applied over the insulation layer.
Figure 4D:
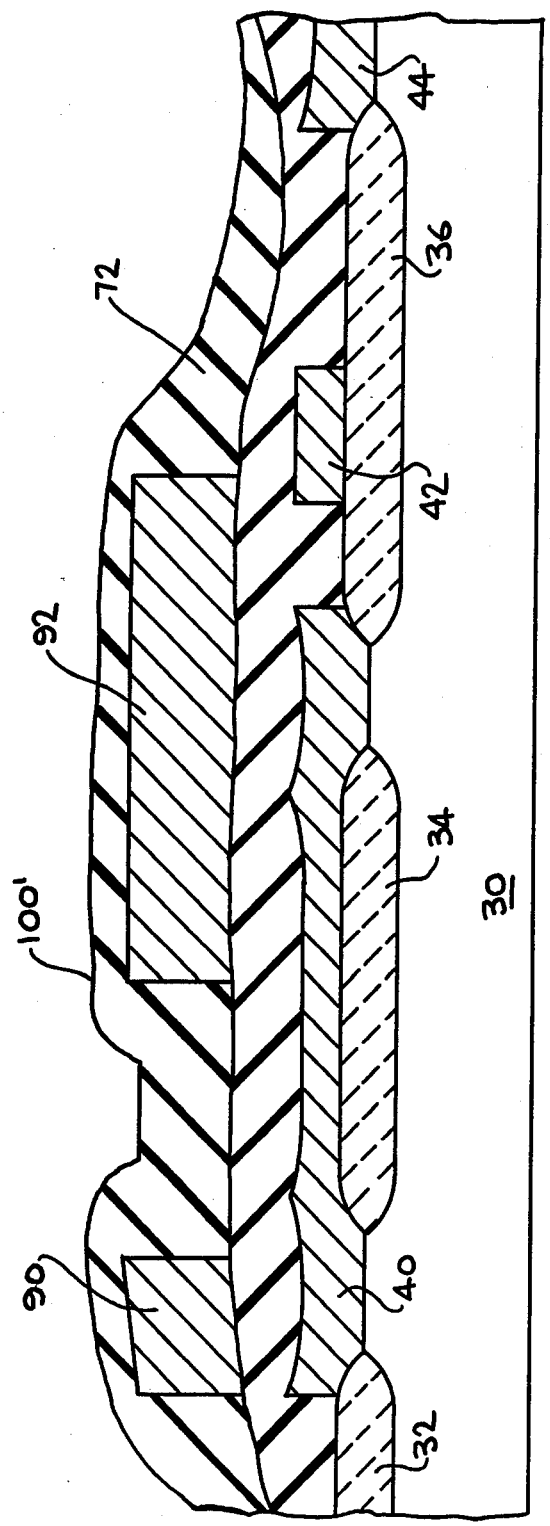
FIG. 4D is a vertical cross-section of the structure of FIG. 4C subjected to a further etching to remove at least a portion of the removable material and insulation material over the second metallization layer.

In FIG. 4C, a layer 110 of photoresist material has been applied over insulation layer 100. The photoresist layer 110, it will be noted, fills in the portions adjacent cusps 102, 104, 106, and 108 as well as filling in at 112, the opening 109 left due to the step formed in filling in the opening between metal lines 90 and 92. Insulation layer 100 and photoresist layer 110 are then subject to a dry etching, as in the previous planarization stage, followed by chemical removal of the remainder of photoresist layer 110 to leave an insulation layer 100' over metal lines 90 and 92 as shown in FIG. 4D.

Figure 5A:
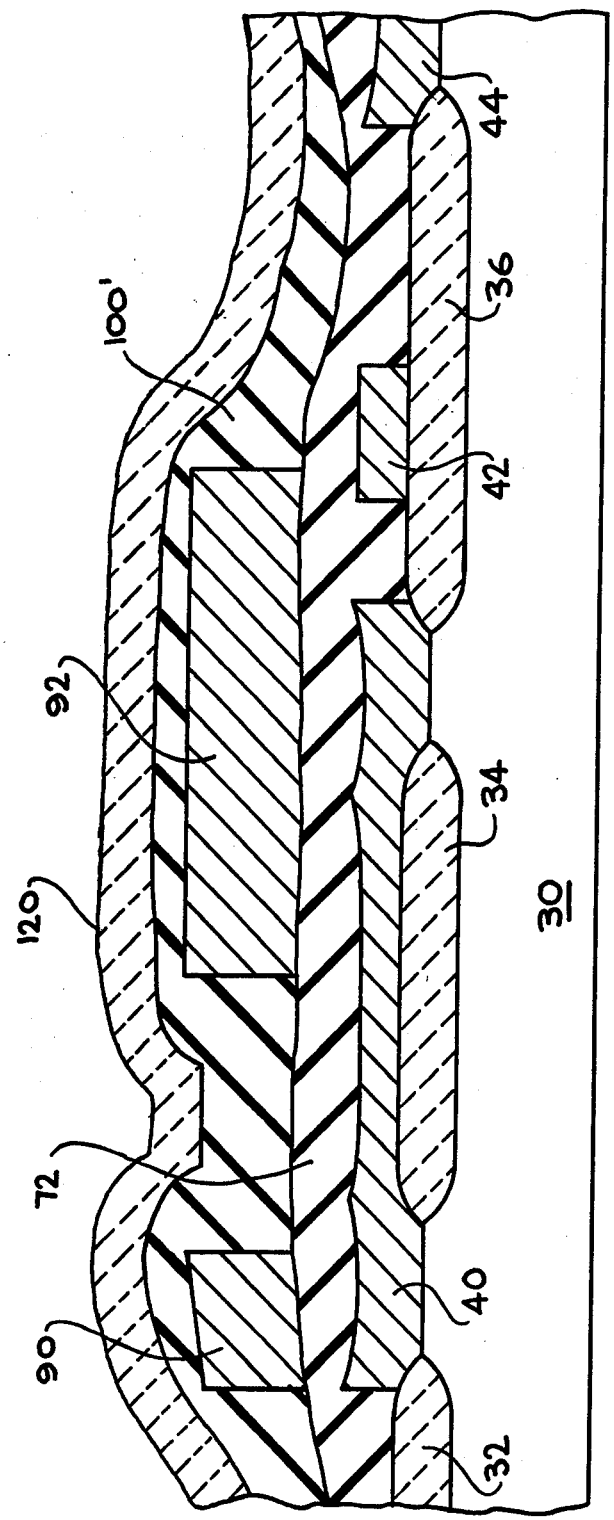
FIG. 5A is a vertical cross-section of the structure of FIG. 4D with a second insulation layer placed over the structure of FIG. 4D.
Figure 5B:
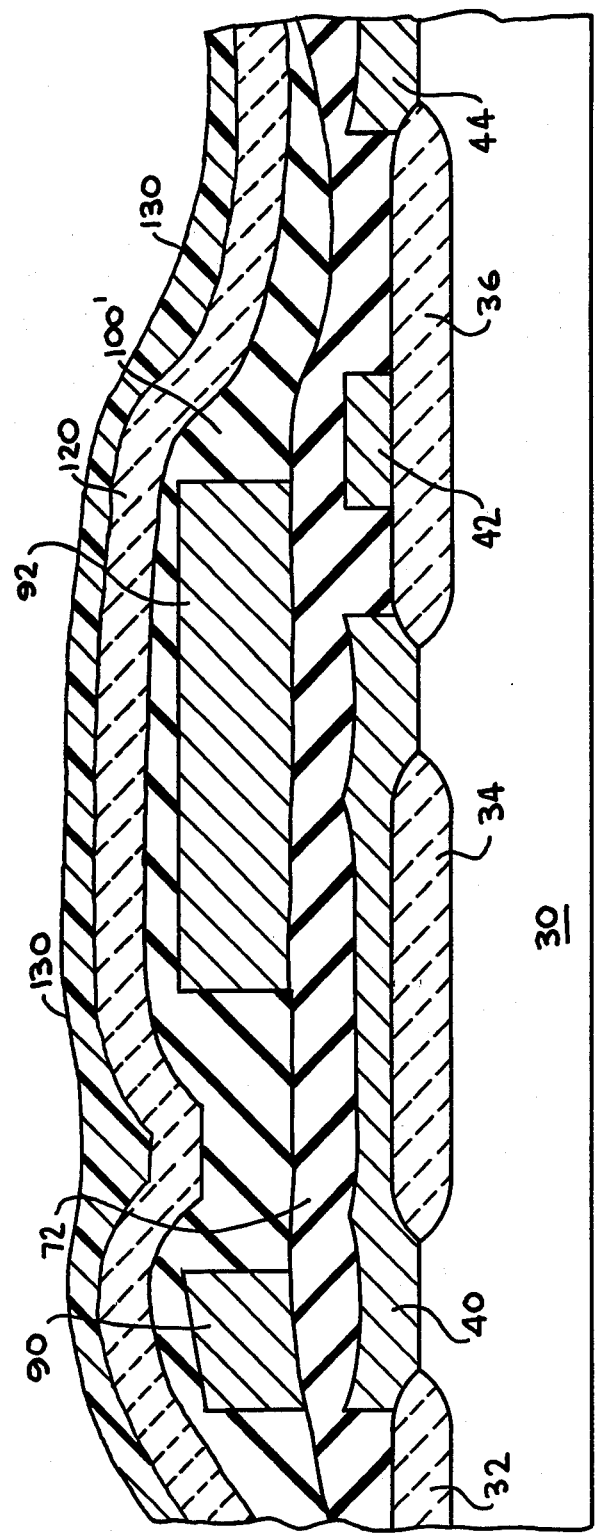
FIG. 5B is a vertical cross-section of the structure of FIG. 5A with a further layer of a second material placed over the second insulation layer.
Figure 5C:
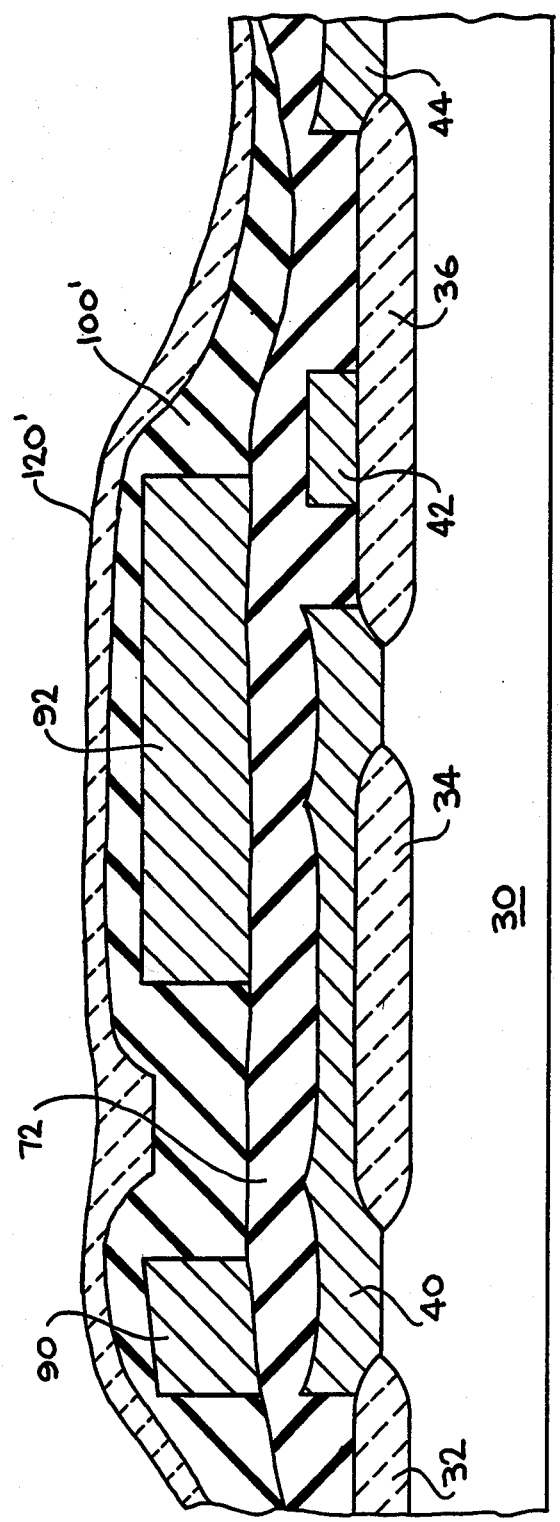
FIG. 5C is a vertical cross-section of the structure of FIG. 5B after being subjected to a further etching to remove a portion of the second material and second insulation layer.
Figure 6:
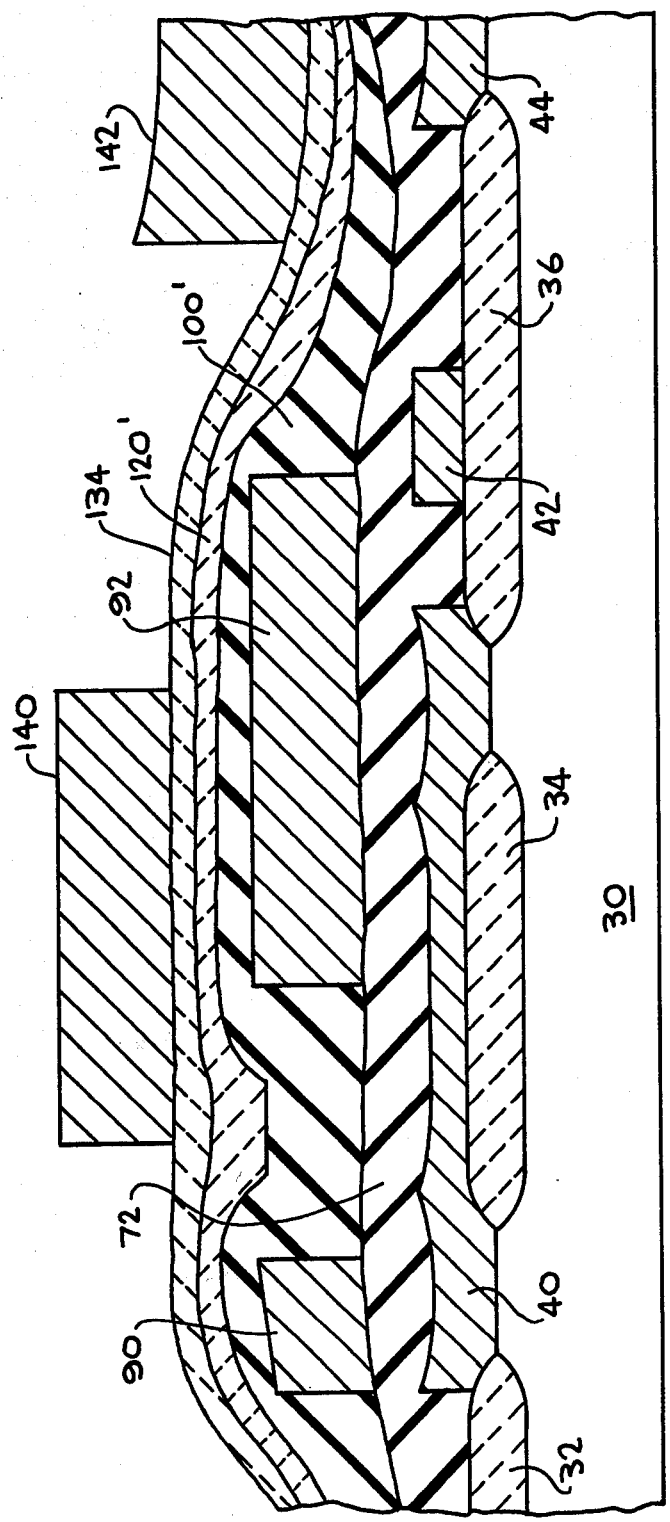
FIG. 6 is a vertical cross-section of the structure of FIG. 5C having a third patterned metallization layer applied thereto.

A second oxide layer 120 is now applied over insulation layer 100' as shown in FIG. 5A followed, optionally, by deposition of a photoresist layer 130 as shown in FIG. 5B. Insulation layer 120 and optional photoresist layer 130 are then subjected to a further dry etching stage followed by selective removal of photoresist layer 130, if present, to provide a second oxide layer 120' over first oxide layer 100'. Layers 120' and 100' may now have applied thereto a layer of insulation 134 followed by application of yet another metallization layer which is patterned to provide metal lines 140 and 142 as shown in FIG. 6.

It should be noted that the two stage planarization process of the invention which has just been described may be used at one level of the manufacturing of the integrated circuit structure together with a single planarization process at another level of metallization if, for example, an overlying metallization layer does not have as small a metal line pitch or as close spacing between the metal lines as in the underlying metallization layer. In such instances it would, of course, be feasible to merely use a single stage of planarization for the upper metallization lines should a third layer of metallization be desired over the second layer of metal lines. It may also be repeated for additional metal layers, if necessary.

Thus, the novel process of the invention, as just described, provides for planarization of an insulation layer placed over metal lines whereby subsequent metallization layers may be placed over the oxide layer without the risk of discontinuities. However, due to the novel two stage planarization, the occurrence of voids, particularly in the deposition of insulation material in the openings created between narrowly spaced metal lines is avoided.

Having thus described the invention, what is claimed is:

1. An improved process for the planarization of an integrated circuit structure comprises:
   (a) applying over a metallization layer, having one or more openings therein, a layer of insulation sufficiently thin to avoid formation of voids in the portion of said insulation deposited in the openings in said metallization layer;
   (b) smoothing said insulation layer by removing the high portions of said insulation;
   (c) applying a further layer of insulation over said first insulation layer; and
   (d) smoothing said further layer of insulation by removing the high portions of said insulation;
whereby the resultant smoothed insulation surface will be substantially planar and substantially void-free.

2. The process of claim 1 wherein said smoothing of said insulation layer is done by dry etching the upper surface of said insulation.

3. The process of claim 2 including the further steps of coating said insulation material with a second etchable material prior to said dry etching step, and removing said second etchable material after said dry etching step.

4. An improved process for planarization of an integrated circuit structure which comprises:
   (a) applying over a metallization layer having one or more openings therein, a layer of insulation sufficiently thin to avoid formation of voids in the portion of said insulation material applied in said one or more openings in said metallization layer;
   (b) coating said insulation with a second material which will, at least partially, fill in the steps formed by said insulation and which is capable of being dry etched;
   (c) dry etching away a portion of said insulation and said second material whereby the highest portions of said insulation will be partially removed;
   (d) selectively removing the remaining portions of said second material;
   (e) applying a further layer of insulation over said first layer; and
   (f) dry etching said further layer of insulation to remove the highest portions of said second layer of insulation
whereby the resultant etched surface will be substantially planar and substantially void-free.

5. The process of claim 4 including the steps of coating said further layer of insulation with a second material capable of being dry etched to at least partially fill in low areas on said insulation; and removing said second material after said dry etching step.

6. The process of claim 4 wherein said first insulation layer is coated with an organic material which may be selectively removed after said dry etching to permit application of said further insulation layer.

7. The process of claim 4 wherein said insulation layers comprise applications of oxide material.

8. The process of claim 7 wherein said oxide material comprises silicon dioxide.

9. The process of claim 7 wherein said dry etching comprises an anisotropic etching.

10. The process of claim 9 wherein said anisotropic etching is an anisotropic reactive ion etching.

11. The process of claim 9 wherein said second material comprises an organic material capable of being partially removed by said dry etching.

12. The process of claim 11 wherein said organic material comprises a photoresist material having a dry etch rate substantially similar to the etch rate of said oxide.

13. An improved process for smoothing the step coverage over a metallization layer for subsequent application of a further metallization layer which comprises:
   (a) applying on said metallization layer, a layer of insulation material selected from the group consisting of silicon dioxide and silicon dioxide doped with phosphorus which is sufficiently thin to permit at least partial filling with said insulation material of openings in said metallization layer without forming voids in the insulation layer;
   (b) coating said insulation layer with a layer of photoresist material to smooth the step coverage of said oxide layer;
   (c) dry etching the photoresist coating and raised portions of the underlying insulation layer;
   (d) selectively removing the photoresist layer;
   (e) applying a second insulation layer selected from the group consisting of silicon dioxide and silicon dioxide doped with phosphorus over said first insulation layer;
   (f) coating said second insulation layer with a further layer of photoresist;
   (g) dry etching said further photoresist coating and raised portions of said underlying insulation layer to smooth the second insulation layer; and
   (h) removing the second photoresist coating.

14. The process of claim 13 wherein a second metallization layer is applied over said second insulation layer.

15. The process of claim 14 wherein a layer of insulation is applied over said second metallization layer, said insulation layer is coated with photoresist material, said photoresist and raised portions of said insulation layer are dry etched, and said photoresist is selectively removed to provide a smooth surface for the application of a third metallization layer.

16. The process of claim 13 wherein a second metallization layer is deposited over said second insulation layer and steps (a) to (h) are then repeated to provide a smooth surface for the application of a third metallization layer.

* * * * *